(12) United States Patent
Wilson

(10) Patent No.: US 10,135,585 B1
(45) Date of Patent: Nov. 20, 2018

(54) ADAPTIVE TRELLIS CODING ENABLING AND DISABLING IN DISCRETE MULTITONE DATA COMMUNICATIONS

(71) Applicant: Adtran, Inc., Huntsville, AL (US)

(72) Inventor: Arlynn W. Wilson, Huntsville, AL (US)

(73) Assignee: Adtran, Inc., Huntsville, AL (US)

( * ) Notice: Subject to any disclaimer, the term of this patent is extended or adjusted under 35 U.S.C. 154(b) by 17 days.

(21) Appl. No.: 15/596,920

(22) Filed: May 16, 2017

(51) Int. Cl.
*H04L 5/00* (2006.01)
*H04M 3/00* (2006.01)

(52) U.S. Cl.
CPC ............ *H04L 5/0046* (2013.01); *H04L 5/006* (2013.01); *H04L 5/0007* (2013.01); *H04M 3/007* (2013.01)

(58) Field of Classification Search
CPC ..... H04L 27/2601; H04L 1/006; H04L 5/007; H04L 5/0046; H04L 5/006; H04L 27/34; H04L 27/36; H04L 27/38
See application file for complete search history.

(56) References Cited

U.S. PATENT DOCUMENTS

| 7,099,401 | B2 * | 8/2006 | Betts | H04L 5/143 375/259 |
| 2002/0136320 | A1 * | 9/2002 | Jin | H04L 1/0043 375/265 |
| 2005/0201480 | A1 | 9/2005 | Jain | |

\* cited by examiner

*Primary Examiner* — Betsy L Deppe
(74) *Attorney, Agent, or Firm* — Smith Tempel Blaha LLC; Michael J. Tempel

(57) ABSTRACT

In a transmitter, first and second sets of discrete multitone (DMT) sub-carrier signals or tones are identified. First and second bit groups of a payload data frame corresponding to the first and second sets of tones are selected. The first bit group is then trellis encoded. The second bit group is not trellis encoded. The first trellis coded tone group and the second bit group are then constellation mapped to produce a DMT symbol for transmission. A receiver may use an estimate of signal-to-noise ratio (SNR) of each tone to determine whether to select the tone for inclusion in the first or second set of tones. The receiver may provide the transmitter with information indicating whether a tone is included the first or second set of tones.

30 Claims, 8 Drawing Sheets

ADAPTIVE TRELLIS CODING ENABLING AND DISABLING IN DISCRETE MULTITONE DATA COMMUNICATIONS

BACKGROUND

Digital Subscriber Line (DSL) refers to data communication technologies that leverage the longstanding infrastructure of bundled twisted-pair copper wires that were originally deployed for analog telephone service as a way of delivering high-speed Internet access. Enhancements to the earliest DSL technology have led to Asymmetric DSL (ADSL), Very High Bit-rate Digital Subscriber Line (VDSL), and VDSL2, among others. The VDSL2 protocol is set forth in the International Telecommunications Union (ITU) standard G.993.2. VDSL2 employs Discrete Multitone (DMT) modulation, which is a form of orthogonal frequency division multiplexing (OFDM). In DMT modulation, the information-carrying frequency band associated with a communication is divided into multiple (e.g., up to several thousand) mutually orthogonal carrier frequencies, also referred to as tones or sub-carrier frequencies. As the sub-carrier frequencies into which a communication is divided are mutually orthogonal, there is no interference between them. However, there may be interference, i.e., crosstalk, between different communications occurring on neighboring wire pairs in a cable bundle. There are two types of crosstalk that can adversely affect a receiver: Far-End Crosstalk (FEXT) and Near-End Crosstalk (NEXT). FEXT is produced by neighboring wire pairs at a transmitter remote from the affected receiver. NEXT is produced by neighboring wire pairs at a transmitter local to the affected receiver.

Bit loading, a feature employed in VDSL transceivers, adaptively allocates the number of bits that are transmitted on each sub-carrier signal. The bit loading feature determines the number of bits to allocate to a sub-carrier signal in response to a measurement of signal-to-noise ratio (SNR) on the sub-carrier signal. Thus, the bit loading feature allocates more bits (and consequently, more bits per second per Hz) to a tone having a higher measured SNR than to a tone having a lower measured SNR. A common set of bit loading levels (i.e., numbers of bits that can be adaptively allocated) consists of integer bits between 1 and 15. A transceiver can adaptively select one of these bit loading levels based on the current measured SNR of a tone.

VDSL2 transceivers also employ a feature known as vectoring, which is a noise cancellation technique. Vectoring is used in VDSL2 specifically to cancel FEXT. Vectoring is described in ITU standard G.993.5, "Self-FEXT cancellation (vectoring) for use with VDSL2 transceivers" (2010).

VDSL and VDSL2 transceivers employ trellis coding, which is an error correcting technique. Trellis coding improves throughput under low SNR conditions. In trellis coding, the bits are divided between "payload bits" (also referred to as "user bits") that encode the information or "payload" of the communication and trellis bits that carry the error-correcting information. For example, at a bit loading level of 15 bits, a trellis bit is allocated every two tones, effectively resulting in 14½ user bits per tone plus ½ trellis bit per tone. In an instance in which trellis coding results in improved throughput, such as in an instance in which SNR is low, the sacrifice of some user bits for trellis bits results in a net "coding gain." Under the ITU VDSL standards, trellis coding is mandatory on all tones. Thus, conventionally, trellis coding is employed on all tones during all VDSL communications.

SUMMARY

Embodiments of the invention relate to selectively applying trellis coding to a first set of tones and not applying trellis coding to a second set of tones in discrete multitone (DMT) data communication.

In one aspect, an exemplary method for DMT data transmission includes identifying a first set of tones and a second set of tones. The method further includes selecting a first bit group comprising a first plurality of bits of a payload data frame, and selecting a second bit group comprising a second plurality of bits of the payload frame. The first bit group corresponds to the first set of tones, and the second bit group corresponds to the second set of tones. The method still further includes trellis encoding the first plurality of bits to produce a first trellis coded tone group. The second bit group, comprising the second plurality of bits, is not trellis coded. The method also includes constellation mapping the first trellis coded tone group and the second bit group to produce a DMT symbol. The DMT symbol is transmitted via a communication channel.

In another aspect, an exemplary method for DMT data reception includes receiving a DMT symbol via a communication channel, and constellation demapping the DMT symbol to produce a first plurality of bits defining a first bit group and a second plurality of bits defining a second bit group. The method further includes trellis decoding the first plurality of bits to produce a plurality of trellis decoder output bits. The method still further includes combining the trellis decoder output bits and the second plurality of bits to produce a payload data frame. The method also includes estimating a signal-to-noise ratio (SNR) of each of a plurality of tones, and selecting a first set of tones and a second set of tones from the plurality of tones by comparing the SNR of each of the tones with a threshold. Information indicating whether a tone is included in the first set of tones or the second set of tones may be sent to a transmitter via a messaging channel.

In still another aspect, an exemplary transmitter system for DMT data communication includes a data frame buffer configured to buffer a payload data frame, a memory configured to store information indicating whether each tone is included in a first set of tones or a second set of tones, and a bit extractor. The bit extractor is configured to select from the data frame buffer first and second bit groups corresponding to the first and second sets of tones. The system further includes a trellis encoder configured to encode the first bit group to produce a first trellis coded tone group. The second bit group is not trellis coded. The system still further includes a constellation mapper configured to produce a DMT symbol in response to the first trellis coded tone group and the second bit group for transmission via a communication channel.

In yet another aspect, an exemplary receiver system for DMT data communication includes a constellation de-mapper configured to de-map a DMT symbol received via a communication channel to produce a first plurality of bits defining a first bit group and a second plurality of bits defining a second bit group, and a trellis decoder configured to decode the first plurality of bits to produce a plurality of trellis decoder output bits. The receiver system further includes a combiner configured to combine the trellis decoder output bits and the second plurality of bits to produce a payload data frame. The exemplary system may further include an SNR estimator configured to estimate an SNR of each of a plurality of tones. The receiver system may include a tone selector configured to select a first set of tones and a second set of tones from the plurality of tones by comparing the SNR of each of the plurality of tones with a threshold. The receiver system may also include a messaging system configured to transmit a message via a messaging channel indicating whether a tone is included in first set of tones or the second set of tones.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
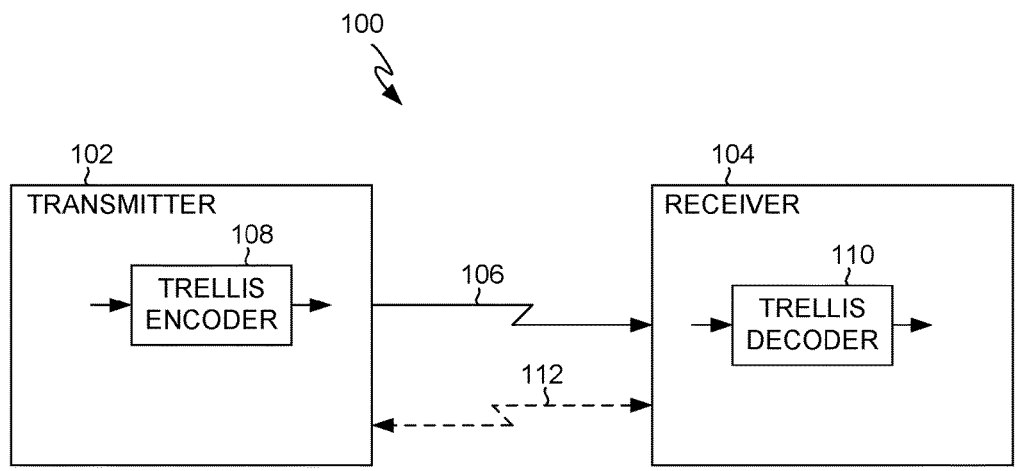
FIG. 1 illustrates an exemplary system for DMT data communication, in accordance with an exemplary embodiment of the invention.

As illustrated in FIG. 1, in an illustrative or exemplary embodiment of the invention, a discrete multitone (DMT) data communication system 100 includes a transmitter portion 102, a receiver portion 104, and a communication link 106. The DMT data communication system 100 may be a portion of, for example, a very high bit-rate digital subscriber line (VDSL) system or, alternatively, a fast access to subscriber terminal (FAST) system. For example, transmitter portion 102 may be a digital subscriber line access multiplexer (DSLAM) of a VDSL system, and receiver portion 104 may be customer premises equipment (CPE) of a VDSL system. Communication link 106 may include optical fiber, twisted pair, or other media, configured to provide one or more communication channels between transmitter portion 102 and receiver portion 104. Although not shown for purposes of clarity, transmitter portion 102 and receiver portion 104 each may be included in a transceiver. Accordingly, communication via communication link 106 may be bidirectional. As described in further detail below, transmitter portion 102 may include, among other elements, a trellis encoder 108, and receiver portion 104 may include, among other elements, a trellis decoder 110. A messaging link 112 is configured to communicate messages or control information between receiver 104 and transmitter 102. Messaging link 112 may, for example, comprise communications in accordance with VDSL Embedded Operations Channel (EOC) standards. Although messaging link 112 is shown for purposes of clarity as separate from communication link 106, VDSL EOC messages may be transmitted via the same physical medium as communication link 106.

Figure 2:
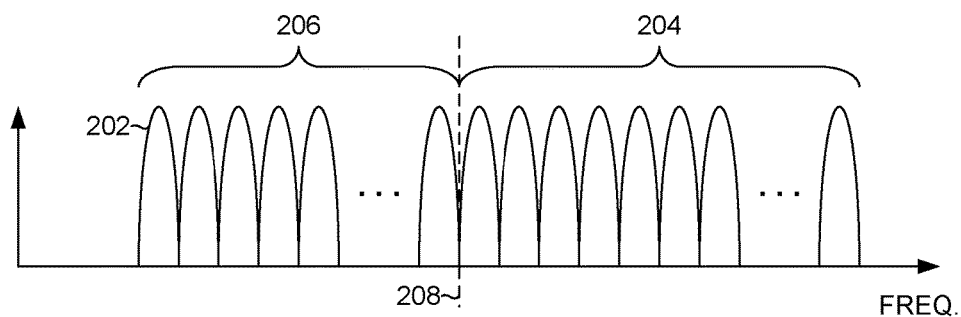
FIG. 2 illustrates a first set of tones and a second set of tones.

As illustrated in FIG. 2, the systems and methods described herein involve selecting, among all tones 202 (i.e., DMT sub-carrier signals), a first set of tones 204 and a second set of tones 206. First set of tones 204 and second set of tones 206 are mutually exclusive, i.e., have no common tones 202. Although in the example illustrated in FIG. 2, first set of tones 204 is higher in frequency than second set of tones 206, the terms "first" and "second" are used herein only for descriptive purposes to distinguish one from the other, and should not be construed as implying an order or other relationship. Thus, in other examples, the DMT sub-carrier signals or tones of a "second" set may be higher in frequency than those of a "first" set. The total number of tones 202 (i.e., the sum of the number of tones 202 in first set of tones 204 and second set of tones 206) may be any number. The boundary or threshold frequency 208 between first set of tones 204 and second set of tones 206 may be any frequency. Although for purposes of clarity the tones 202 in first set of tones 204 and second set of tones 206 are depicted in FIG. 2 as contiguous, tones 202 may be grouped in bands, spaced apart from one another in frequency (e.g., by guard bands), as well understood by one of ordinary skill in the art. A reference herein to "all" tones 202 means all tones that are on or active during a payload frame transmission. Although in the example illustrated in FIG. 2 each set of tones consists of contiguous tones, in other examples (not shown), portions of one set of tones may alternate or otherwise be interspersed with portions of the other set of tones, and the tones of each set identified through an indexing array.

Figure 3:
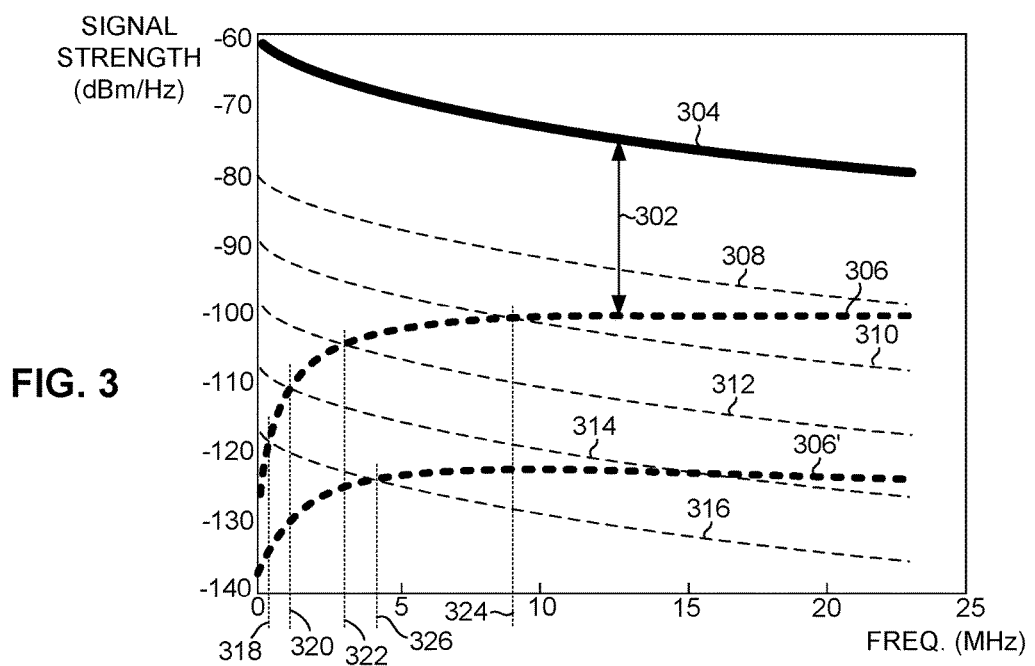
FIG. 3 is an example of a plot illustrating a comparison of various exemplary signals relating to exemplary methods for DMT data communication.

In an example illustrated in FIG. 3, a separation 302 between a received signal 304 and far-end crosstalk (FEXT) 306 on communication link 106 (FIG. 1) represents a signal-to-noise ratio (SNR). As may be appreciated by one of ordinary skill in the art, received signal 304 and FEXT 306 depend upon factors such as the length of the wires (commonly referred to as a "loop") in communication link 106, the wire gauge, etc., and their plots in FIG. 3 represent only one example of the effect of such factors.

Transmitter portion 102 (FIG. 1) may employ bit loading (also known as bit allocation). In a VDSL system, a common set of bit loading levels (i.e., numbers of bits that can be adaptively allocated) consists of an integer number of bits between 1 and 15. Similarly, in a FAST system, a common set of bit loading levels consists of an integer number of bits between 1 and 12. A transceiver can adaptively select a bit loading level based on the current measured SNR of a tone. The above-referenced separation 302 between received signal 304 and FEXT 306 includes an SNR that is achieved in an example in which bit loading is not employed. In an example in which bit loading is employed: the separation between received signal 304 and FEXT 306 includes an SNR 308 that would be required to provide a 3-bit loading level; the separation between received signal 304 and FEXT 306 includes an SNR 310 that would be required to provide a 6-bit loading level; the separation between received signal 304 and FEXT 306 includes an SNR 312 that would be required to provide a 9-bit loading level; the separation between received signal 304 and FEXT 306 includes an SNR 314 that would be required to provide a 12-bit loading level; and the separation between received signal 304 and FEXT 306 includes an SNR 316 that would be required to provide a 15-bit loading level.

The noise level represented by FEXT 306 effectively limits the number of bits that can be allocated to any tone 202 (FIG. 2). Accordingly, in the example shown in FIG. 3, FEXT 306 limits transmitter portion 102 to allocating maximums of: 15 bits to tones at less than a frequency 318; 12 bits to tones at less than a frequency 320; 9 bits to tones at less than a frequency 322; 6 bits to tones at less than a frequency 324; and less than 6 bits to the remaining tones at greater than frequency 324.

Transmitter portion 102 may employ trellis coding. Trellis coding may achieve a net coding gain even though trellis coding sacrifices some payload bits by transmitting trellis code bits during the time in which payload bits would otherwise be transmitted. The net amount of coding gain achieved by trellis coding in a particular instance of operation depends upon how many tones are trellis coded, how many bits are allocated to each of those tones by bit loading, and the amount of Reed Solomon coding and interleaver concatenated as an outer Forward Error Correction. Conventionally, in accordance with ITU VDSL standards G.992.3/5, G.993.2 and G.993.5, multidimensional WEI trellis coding is mandatory on all tones. Generally, trellis coding provides a greater coding gain when SNR is low and fewer bits are allocated to more tones than when SNR is high and more bits are allocated to fewer tones, because coding gain decreases as more payload bits are utilized. In the example shown in FIG. 3, in the presence of FEXT 306, essentially no coding gain is likely achieved by trellis coding tones allocated 15 bits, i.e., tones at less than frequency 318, because bit loading limits allocation of 15 bits to only the relatively few tones at less than frequency 318 (e.g., less than a few hundred kHz).

Transmitter portion 102 may employ vectoring to reduce or eliminate FEXT 306. For example, if transmitter portion 102 were to reduce FEXT 306 to FEXT 306' by employing vectoring or some other technique, transmitter portion 102 could allocate a greater number of bits to a greater number of tones. In the presence of FEXT 306' instead of FEXT 306, transmitter portion 102 could allocate 15 bits to tones at less than a frequency 326. However, trellis coding tones at less than frequency 326 may result in little net coding gain, no coding gain, or even a negative net coding gain because the negative effect of sacrificing the relatively large number of payload bits (of the relatively large number of tones allocated 15 bits) weighs heavily against the positive effect of trellis coding. Note that if transmitter portion 102 were to essentially eliminate FEXT 306 entirely, transmitter portion 102 could allocate 15 bits to all tones.

Figure 4:
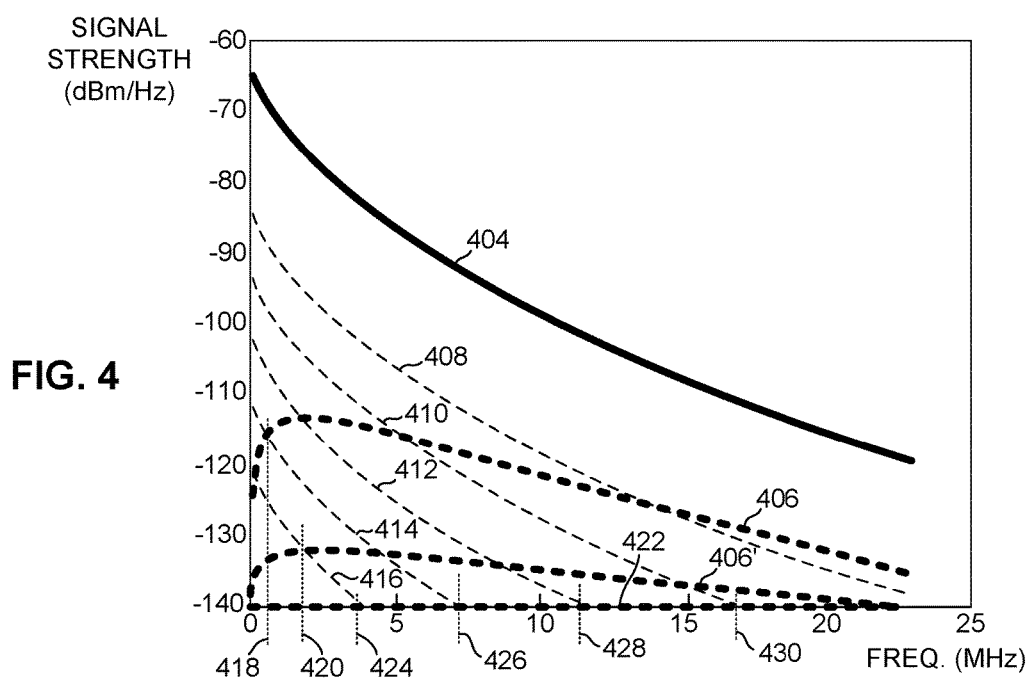
FIG. 4 is another example of a plot similar to FIG. 3.

The example illustrated in FIG. 4 is similar to the example illustrated in FIG. 3, but illustrates a common effect of a longer loop (i.e., communication link 106). More specifically, the received signal 404 and FEXT 406 are more attenuated at higher frequencies compared with received signal 304 (FIG. 3). Transmitter portion 102 (FIG. 1) may utilize any integer bit loading level between, for example, 1 and 15. In the example illustrated in FIG. 4: the separation between received signal 404 and FEXT 406 includes an SNR 408 that would be required to provide a 3-bit loading level; the separation between received signal 404 and FEXT 406 includes an SNR 410 that would be required to provide a 6-bit loading level; the separation between received signal 404 and FEXT 406 includes an SNR 412 that would be required to provide a 9-bit loading level; the separation between received signal 404 and FEXT 406 includes an SNR 414 that would be required to provide a 12-bit loading level; and the separation between received signal 404 and FEXT 406 includes an SNR 416 that would be required to provide a 15-bit loading level. In this example, FEXT 406 effectively imposes a limit that prevents allocating 15 bits to essentially any tones.

Transmitter portion 102 may employ vectoring to reduce or eliminate FEXT 406. For example, if transmitter portion 102 were to reduce FEXT 406 to FEXT 406' by employing vectoring or some other technique, transmitter portion 102 could allocate a greater number of bits to a greater number of tones. In the presence of FEXT 406' instead of FEXT 406, transmitter portion 102 could allocate 15 bits to tones at less than a frequency 420. However, trellis coding tones at less than frequency 420 may result in little net coding gain, no coding gain, or even a negative net coding gain because the negative effect of sacrificing the relatively large number of payload bits (of the relatively large number of tones allocated 15 bits) weighs heavily against the positive effect of trellis coding.

In the example shown in FIG. 4, even if transmitter portion 102 were to employ vectoring or other technique to eliminate FEXT 406 entirely, a noise floor 422 (e.g., at −140 dBm/Hz) would effectively limit transmitter portion 102 in the manner graphically represented by the intersections of bit loading levels 408-416 with noise floor 422. That is, transmitter portion 102 would be limited to allocating a maximum of: 15 bits to tones at less than a frequency 424; 12 bits to tones at less than a frequency 426; 9 bits to tones at less than a frequency 428; 6 bits to tones at less than a frequency 430; and 3 bits to the remaining tones at greater than frequency 430. Trellis coding tones at less than frequency 424 is likely to result in a negative net coding gain because the negative effect of sacrificing the relatively large number of payload bits (of the relatively large number of tones allocated 15 bits) weighs heavily against the positive effect of trellis coding.

The above-described examples illustrate that enabling trellis coding of a first set of tones while disabling trellis coding of a second set of tones may avoid a negative net coding gain. In the example described above with regard to FIG. 4, in which all FEXT is eliminated and only noise floor 422 limits bit loading, the systems and methods described herein may selectively enable trellis coding of a first set of tones at greater than frequency 424 and selectively disable trellis coding of a second set of tones at less than frequency 424. As described below with regard to exemplary methods, in a given instance of operation, a boundary or threshold frequency, such as frequency 424 in the foregoing example, may be related to SNRs of the tones and bit loading levels.

Figure 5:
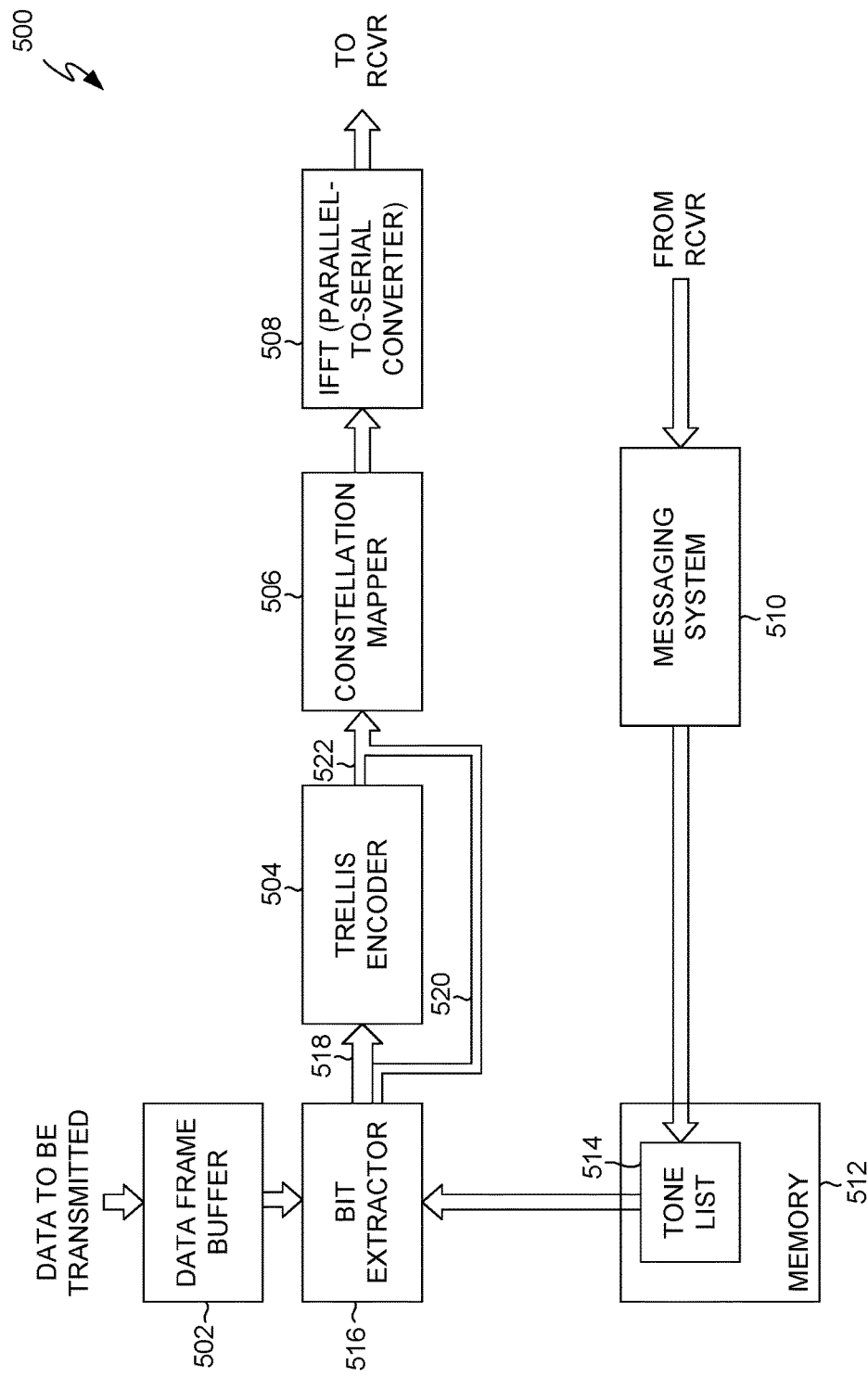
FIG. 5 is a block diagram illustrating a transmitter portion of an exemplary system for DMT data communication, in accordance with an exemplary embodiment of the invention.

As illustrated in FIG. 5, a transmitter 500 may be an example of transmitter portion 102 (FIG. 1). Transmitter 500 may be, for example, a near-end transmitter in a VDSL system or, alternatively, a near-end transmitter in a FAST system. Transmitter 500 includes a data frame buffer 502, a trellis encoder 504, a constellation mapper 506, a parallel-to-serial converter 508, a messaging system 510, a memory 512 configured to store a tone list 514 or other information indicating whether each tone is included in the first set of tones or the second set of tones, and a bit extractor 516. In addition to the foregoing elements, other elements commonly included in conventional VDSL or FAST transmitters as known to one of ordinary skill in the art may be included in transmitter 500 but are not shown for purposes of clarity.

Data frame buffer 502 is configured to store one or more payload data frames, i.e., the data to be transmitted. Bit extractor 516 is configured to extract a plurality of (L) bits from data frame buffer 502. Bit extractor 516 is further configured to select, from among the L bits, a first bit group 518 comprising a first plurality of (L-M) bits in data frame buffer 502 and a second bit group 520 comprising a second plurality of (M) bits in data frame buffer 502. The first and second bit groups 518 and 520 correspond to the first and second sets of tones, respectively. Accordingly, tone list 514 serves as a control input to bit extractor 516, and bit extractor 516 extracts or selects first bit group 518 and second bit group 520 based on tone list 514.

The first bit group 518 is provided directly to the input of trellis encoder 504, which is configured to encode first bit group 518 to produce a first trellis coded tone group 522. First trellis coded tone group 522 is provided to a portion of the input of constellation mapper 506. Second bit group 520 is provided directly to another portion of the input of constellation mapper 506, bypassing trellis encoder 504. Constellation mapper 506 is configured to map the combination of first trellis coded tone group 522 and second (non-trellis coded) bit group 520 to Quadrature Amplitude Modulation (QAM) points. Using an inverse fast-Fourier transform (IFFT), parallel-to-serial converter 508 is configured to convert the parallel-format data that is output by constellation mapper 506 to a serial data format to produce a DMT symbol. Transmitter 500 may transmit a stream of such DMT symbols via communication link 106 (FIG. 1).

Messaging system 510 is configured to receive a message from a remote source, such as a receiver 600 described below with regard to FIG. 6. As well understood by one of ordinary skill in the art, conventional VSDL systems may employ a messaging system that allows transmitters and receivers to exchange messages using messaging channel 112 (FIG. 1). The message may, for example, comprise tone list 514 or elements thereof, or other information identifying one or more tones and indicating whether a tone is included in the first set of tones or the second set of tones. Alternatively, as described in further detail below, the message may comprise information identifying one or more tones and information enabling transmitter 500 to determine whether to include a tone in the first set of tones or the second set of tones. Messaging system 510 may store or otherwise update tone list 514 in memory 512 in response to receiving the message. Other aspects of the messaging system may be conventional and are therefore not described herein.

Tone list 514 may be organized in any manner. For example, tone list 514 may include information individually identifying each tone in the first set and the second set. Alternatively, tone list 514 may include information identifying each tone in only one of the first and second sets but not the other. Alternatively, tone list 514 may include information identifying a range of tones, such as a lowest tone and a highest tone, in one or both of the first and second sets. For example, the received message may include such information identifying a range of tones, and messaging system 510 may use the information to update tone list 514.

Figure 6:
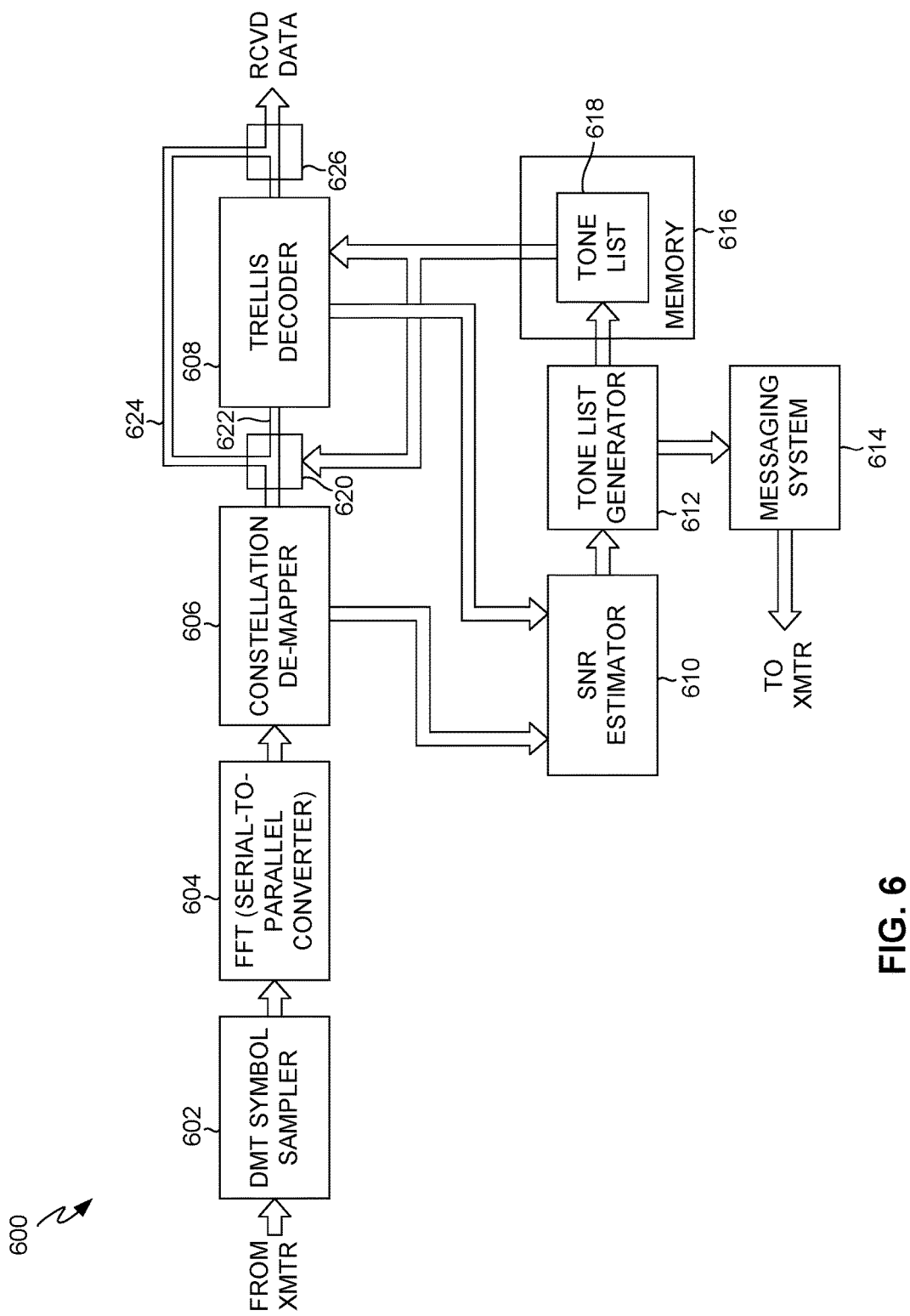
FIG. 6 is a block diagram illustrating a receiver portion of an exemplary system for DMT data communication, in accordance with an exemplary embodiment of the invention.

As illustrated in FIG. 6, a receiver 600 may be an example of receiver portion 104 (FIG. 1). Receiver 600 includes a DMT symbol sampler 602, a serial-to-parallel converter 604, a constellation de-mapper 606, a trellis decoder 608, an SNR estimator 610, a tone list generator 612, a messaging system 614, and a memory 616 configured to store a tone list 618. In addition to the foregoing elements, other elements commonly included in conventional VDSL or FAST receivers as known to one of ordinary skill in the art may be included in receiver 600 but are not shown for purposes of clarity.

Receiver 600 receives DMT symbols. For example, receiver 600 may be a far-end VDSL or FAST receiver that receives a stream of DMT symbols from transmitter 500 (FIG. 5) via communication link 106 (FIG. 1). DMT symbol sampler 602 is configured to provide each received DMT symbol to serial-to-parallel converter 604. Serial-to-parallel converter 604 is configured to convert the received DMT symbol from a serial data format to a parallel data format using a fast Fourier transform (FFT). The parallel-format data that is output by serial-to-parallel converter 604 is provided to the input of constellation de-mapper 606. Constellation de-mapper 606 is configured to de-map the parallel-format data from QAM points.

The output of constellation de-mapper 606 is provided to a data splitter 620. Based on tone list 618, data splitter 620 selects, from among the resulting data bits that define the output of constellation de-mapper 606, a first set of resulting data bits 622 corresponding to the first set of (trellis coded) tones and a second set of resulting data bits 624 corresponding to the second set of (non-trellis coded) tones. The first set of resulting data bits 622 is provided to the input of trellis decoder 608. Trellis decoder 608 is configured to decode the first set of resulting data bits 622 into L-M decoded bits. A data combiner 626 combines the L-M decoded bits with the second set of M resulting data bits 624 to define a payload data frame, i.e., the received data.

The outputs of constellation de-mapper 606 and trellis decoder 608 are also provided to SNR estimator 610, which is configured to estimate the SNR of each tone. Tone list generator 612 is configured to select the first and second sets of tones by comparing the SNR of each tone with a threshold. Tone list generator 612 may generate tone list 618 or a portion thereof, or information otherwise indicating whether a tone is included in the first set of tones or the second set of tones, as described above with regard to FIG. 5.

Messaging system 614 may be configured to transmit a message to transmitter 500 (FIG. 5) via messaging link 112 comprising tone list 618 or elements thereof (e.g., a tone or range of tones for transmitter 500 to add to remove from its tone list 514). Transmitter 500 may store or otherwise maintain tone list 514 based on the messaging information that transmitter 500 receives from receiver 600. Alternatively, or in addition, receiver 600 may receive information from transmitter 500 via messaging link 112 that aids receiver 600 in compiling or otherwise maintaining tone list 618. For example, receiver 600 could send a message to transmitter 500 identifying one or more tones and associated SNR values. Transmitter 500 could compare the SNR values with a threshold, update its tone list 514 in accordance with the result of the comparison, and share the result with receiver 600 via messaging link 112. Through the messaging described herein, tone lists 514 and 618 may be maintained essentially identical to each other during normal communication of payload data.

Figure 7:
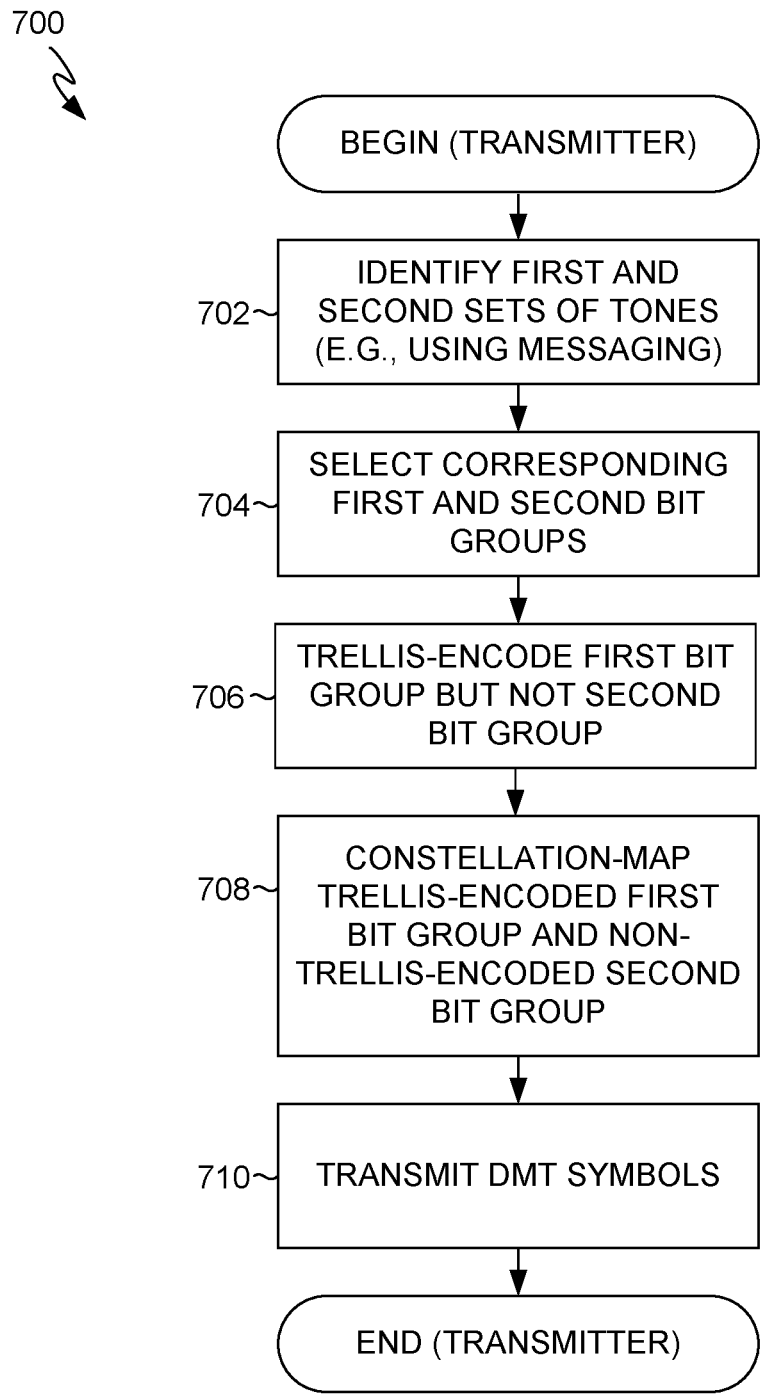
FIG. 7 is a flow diagram illustrating an exemplary method for DMT data communication, in accordance with an exemplary embodiment of the invention.

As illustrated in FIG. 7, an exemplary method 700 for DMT data communication may be performed by a device such as, for example, above-described transmitter 500 (FIG. 5). In the following descriptions of exemplary methods, although certain acts or steps described below naturally precede others for the exemplary embodiments to operate as described, the invention is not limited to the order of those acts or steps if such order or sequence does not alter the functionality of the invention. That is, it is recognized that some acts or steps may be performed before, after, or in parallel (i.e., substantially simultaneously) with other acts or steps without departing from the scope and spirit of the invention. In some instances, certain acts or steps may be omitted or not performed, without departing from the scope and spirit of the invention. Further, words such as "thereafter," "then," "next," etc., are not intended to limit the order of the acts or steps. Rather, such words are used as aids in guiding the reader through the descriptions of the exemplary methods.

As indicated by block 702, first and second sets of tones (i.e., DMT sub-carrier signals) are identified. For example, transmitter 500 may access above-described tone list 514. Tone list 514 or elements thereof may be received from another device, such as, for example, receiver 600 (FIG. 6) via messaging link 112. Alternatively, or in addition, transmitter 500 may update tone list 514 in response to receiving a message from another device, such as, for example, receiver 600 via messaging link 112. Transmitter 500 may receive or update tone list 514 at any time using and may use coordinated signaling. For example, tone list 514 may be received or updated during a training operation preceding a communication session between transmitter 500 and receiver 600. Alternatively, or in addition, tone list 514 may be received or updated during such a communication session.

As indicated by block 704, first and second bit groups, each comprising a plurality of bits of a payload data frame, are selected. The first and second bit groups correspond to the first and second sets of tones. As indicated by block 706, the first bit group is trellis coded. The second bit group is not trellis coded. As indicated by block 708, the first (trellis coded) bit group and the second (non-trellis coded tone group) are constellation mapped to QAM complex values, using an IFFT, to produce a time domain DMT symbol corresponding to the DMT payload data. As indicated by block 710, the DMT symbols are transmitted via a channel (e.g., communication link 106).

Figure 8A:
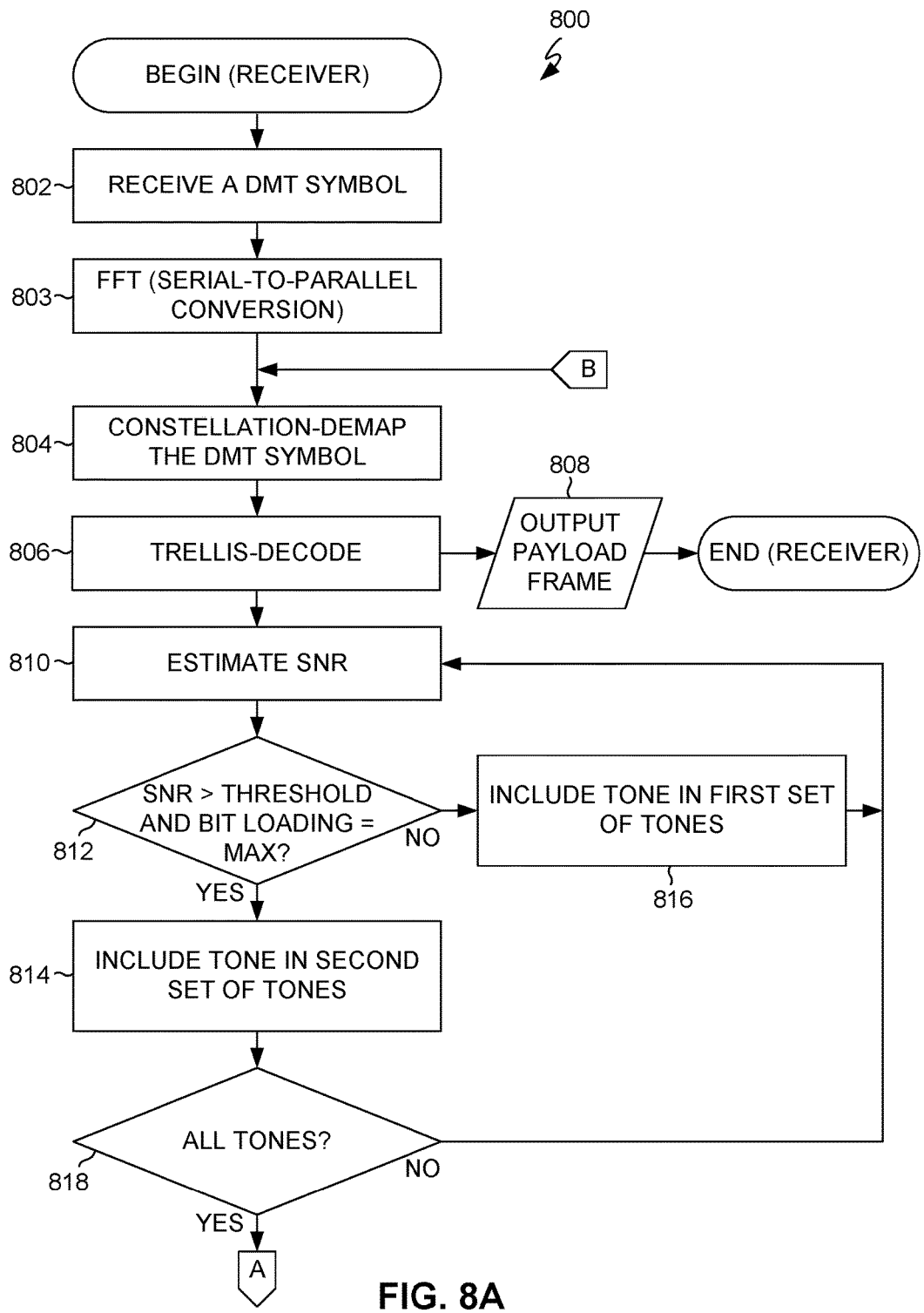
FIG. 8A is a flow diagram illustrating another exemplary method for DMT data communication, in accordance with an exemplary embodiment of the invention.
Figure 8B:
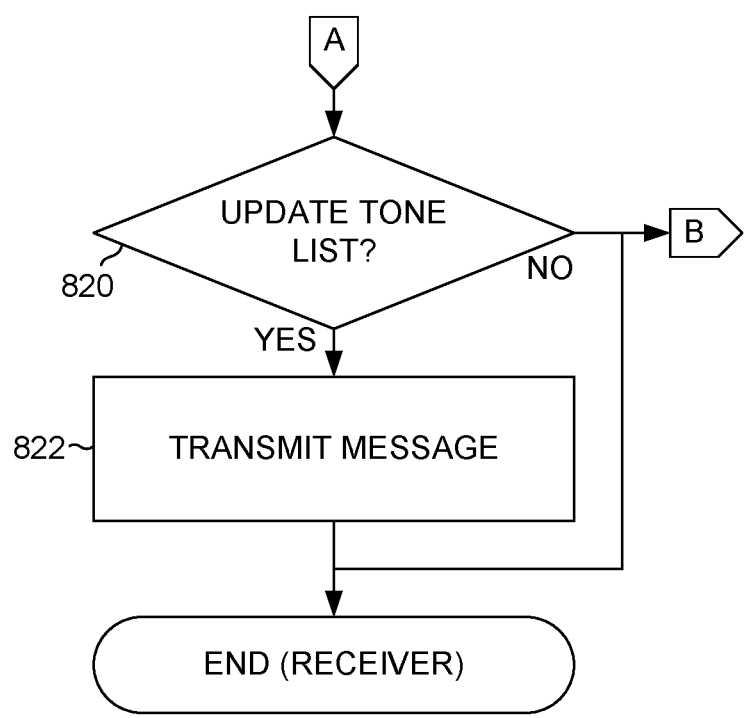
FIG. 8B is a continuation of the flow diagram of FIG. 8A.

As illustrated in FIGS. 8A-8B, an exemplary method 800 for DMT data communication may be performed by a device such as, for example, above-described receiver 600 (FIG. 6). As indicated by block 802 (FIG. 8A), a DMT symbol is received via a channel (e.g., communication link 106) from a transmitter, such as transmitter 500 (FIG. 5). Note that the set of tones that transmitter 500 used to produce the DMT symbol consists of the first and second sets of tones. As indicated by block 803, the DMT symbol is converted from serial to parallel (e.g., using a FFT). As indicated by block 804, the received DMT symbol is constellation de-mapped. The first set of resulting data bits are then trellis decoded, as indicated by block 806. A second set of resulting data bits are combined with the first set to produce the resulting payload data frame 808 or otherwise used in a conventional manner. For example, the payload data frame 808 may be processed using Reed Solomon Decoding.

As indicated by block 810, SNRs of all tones are estimated. The SNR of a tone may be estimated using the inputs and outputs of the constellation demapping and trellis decoding described above with regard to blocks 804 and 806, respectively. The SNR may be estimated in a conventional manner, such as by the method commonly referred to as constellation slicing or decision. In constellation slicing, the differences between the complex value before and following the slice define the error. The magnitude of the error represents the noise for use in SNR estimation.

As indicated by block 812, the SNR of a tone is compared with a threshold. If it is determined (block 812) that the SNR of a tone exceeds the threshold, and the bit loading level is a maximum, then the tone is added to or otherwise included in the second set of tones, as indicated by block 814. As described above, the second set of tones will not be trellis coded. If it is determined (block 812) that the SNR of a tone does not exceed the threshold, or if the bit loading level is not the maximum, then the tone is added to or otherwise included in the first set of tones, as indicated by block 816. As described above, the first set of tones will be trellis coded.

The "maximum bit loading level," as the term is used herein, is the bit loading level that carries the greatest weight in whether the net coding gain is negative or not negative (i.e., zero or positive). In the example described above with regard to FIG. 4, the 15-bit loading level weighs more heavily in this respect than the other bit loading levels. In that example, trellis coding tones below frequency 420 would undesirably result in a net negative net coding gain. Accordingly, tones below frequency 420 would be added to or otherwise included in the second set of tones, whereas tones above frequency 420 would be added to or otherwise included in the first set of tones. In this manner, the first and second sets of tones are selected. As indicated by block 818, the steps described above with regard to blocks 810-816 are applied to all tones. When the steps described above with regard to blocks 810-816 have been applied to all tones, tone list 514 (FIG. 5) may be generated or updated.

It should be understood that references in this disclosure to specific bit loading levels or maximum bit loading levels, such as 15 bits or 12 bits, is intended only to be exemplary. For example, although maximums of 15 bits and 12 bits are commonly employed in VDSL and FAST systems, respectively, other bit loading levels may be employed.

Tone list 514 (FIG. 5) may be maintained by transmitter 500 based on information generated by receiver 600 and transmitted to transmitter 500 via messaging link 112. For example, receiver 600 may generate tone list 618 by estimating SNR in the manner shown in FIGS. 5 and 8A, in which VDSL receiver 500 compares each SNR value with a threshold and adds the tone to the first or second set in accordance with the result of the comparison. Alternatively, in other embodiments receiver 600 could send the SNR values per tone to transmitter 500 via messaging link 112, and transmitter 500 could compare the SNR values with a threshold and add the tone to the first or second set (e.g., in a tone list) in accordance with the result of the comparison. In such an embodiment, transmitter 500 could share the resulting tone list with receiver 600 or advise receiver 600 of the tone or tones to be added to the tone list by sending a message via messaging link 112.

Generating or updating tone lists 514 and 618 or related information in the manner described above may occur at any time. For example, tone lists 514 and 618 may be generated, shared, updated, etc., during a training operation preceding a communication session between transmitter 500 and receiver 600. Alternatively, or in addition, tone lists 514 and 618 may be generated, shared, updated, etc., during such a communication session. As indicated by block 820 (FIG. 8B), it may be determined whether a condition has occurred. The condition may include whether a threshold amount of time has elapsed since previously generating, sharing, updating, etc., one or both of tone lists 514 and 618. Alternatively, or in addition, the condition may include whether a tone that has been added to or otherwise included in the second set of tones (block 814) was previously included in the first set of tones, or whether a tone that has been added to or otherwise included in the first set of tones (block 816) was previously included in the second set of tones. If it is determined (block 820) that the condition has occurred, then a message is transmitted from receiver 600 to transmitter 500, as indicated by block 822. This message may include tone list 618 or, alternatively, may include update information that transmitter 500 can use to update tone list 514. Such update information may include information identifying one or more tones for transmitter 500 to add to or remove from tone list 514. Alternatively, such update information may include information identifying one or more tones for transmitter 500 to move within tone list 514, so as to indicate a change in association with the first and second sets of tones.

A tone list may be represented in any form. For example, a tone list may comprise a series of ones and zeros corresponding to the list of tones currently in use, where the ones represent membership in the first set of (trellis coded) tones and zeroes represent membership in the second set of (non-trellis coded) tones, or vice versa.

Method 800 may be performed repeatedly during a communication session, as a stream of DMT symbols is received. It should be understood that for purposes of clarity the method steps are described above without regard to relative timing. For example, portions of method 800, such as the portion indicated by blocks 812-822, may be performed less frequently than other portions of method 800, such as the portion indicated by blocks 802-808.

Figure 9:
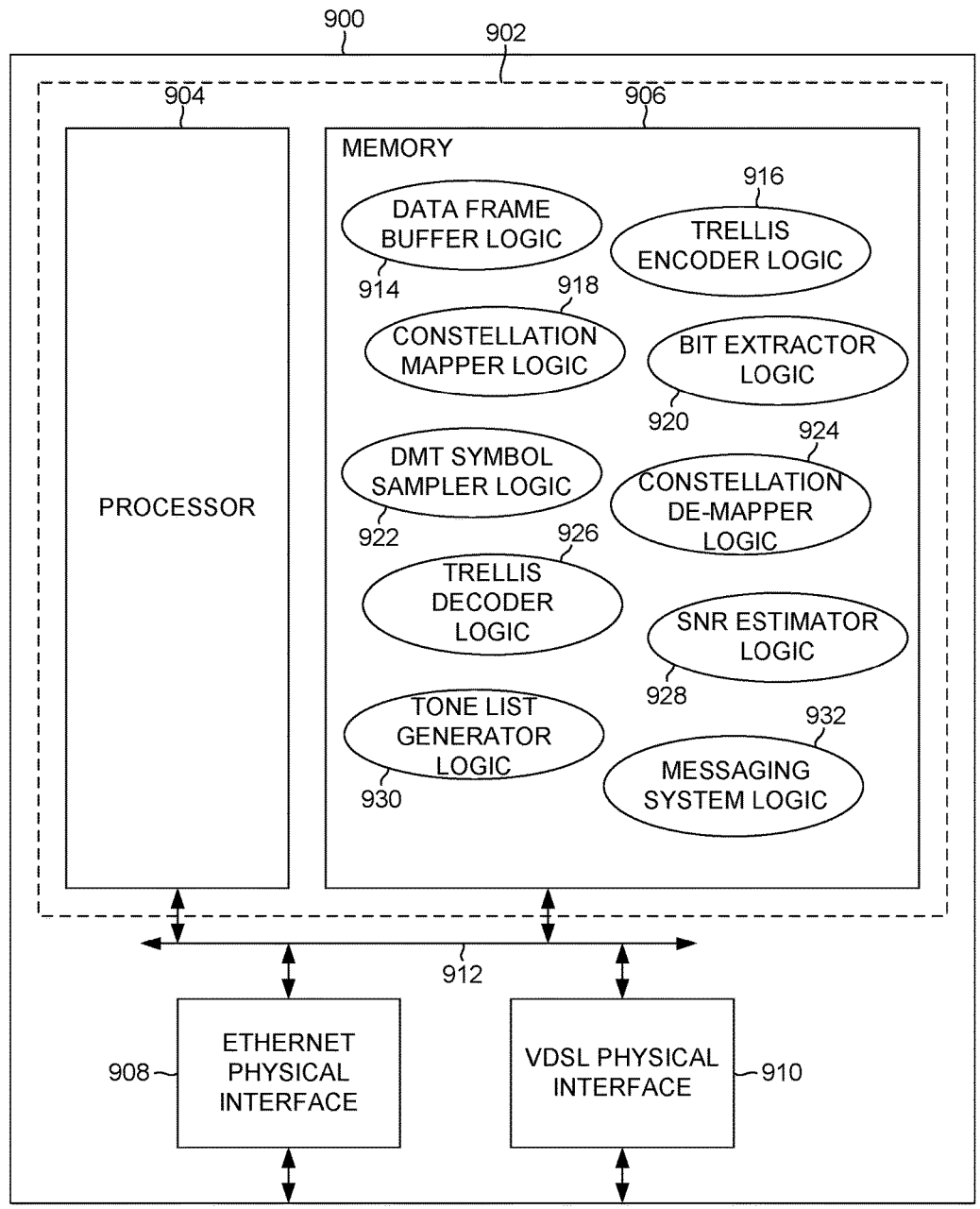
FIG. 9 is a block diagram of a transceiver, in accordance with an exemplary embodiment of the invention.

As illustrated in FIG. 9, a transceiver 900, which may be a DSLAM, CPE, or other VDSL device or a FAST device, may include a processing system 902 comprising a processor 904 and a memory 906. Transceiver 900 may further include an Ethernet physical interface 908 and a VDSL physical interface 910. The above-described payload data frames may be communicated via Ethernet physical interface 908 in a conventional manner as known to one of ordinary skill in the art. The above-described stream of DMT symbols may be communicated via VDSL physical interface 910 in a conventional manner as known to one of ordinary skill in the art. Additional elements commonly included in a conventional DSLAM, CPE, or other VDSL, or FAST device as known to one of ordinary skill in the art may be included in transceiver 900 but are not shown for purposes of clarity. Processor 904 and memory 906 may communicate signals with each other and with other devices via one or more interconnects 912, such as buses. In accordance with conventional computing principles, processor 904 operates under the control of software or firmware code, which configures processing system 902 to control various functions or methods, including the methods described herein. Such methods may also include conventional methods controlled by a DSLAM, CPE, or other VDSL device.

Transceiver 900 is configured with processing logic that can include data frame buffer logic 914, trellis encoder logic 916, constellation mapper logic 918, bit extractor logic 920, DTM symbol sampler logic 922, constellation de-mapper logic 924, trellis decoder logic 926, SNR estimator logic 928, tone list generator logic 930, and messaging system logic 932. Also, although not shown for purposes of clarity, tone list 514 (FIG. 5) and other data may be stored in memory 906, which may be an example of memory 512 (FIG. 5).

Although data frame buffer logic 914, trellis encoder logic 916, constellation mapper logic 918, bit extractor logic 920, DTM symbol sampler logic 922, constellation de-mapper logic 924, trellis decoder logic 926, SNR estimator logic 928, tone list generator logic 930, and messaging system logic 932 are shown in FIG. 9 in a conceptual manner as stored in or residing in memory 906, one of ordinary skill in the art understands that such logic elements arise through the operation of processor 904 in accordance with conventional computing device principles. That is, software or firmware contributes to programming or configuring processing system 902 to be characterized by such logic elements. Although memory 906 is depicted in FIG. 9 as a single or unitary element for purposes of clarity, memory 906 can be of any suitable type and can have any suitable structure, such as one or more modules, chips, etc. Memory 906 can be of a non-volatile type, such as flash memory. Likewise, although processor 904 is depicted in FIG. 9 as a single or unitary element for purposes of clarity, processor 904 can be of any suitable type and can have any suitable structure, such as one or more modules, chips, etc. For example, processor 904 can comprise one or more microprocessors or microcontrollers. Some or all of the foregoing processing system elements can be provided in, for example, an application-specific integrated circuit (ASIC) or other integrated digital device. It should be understood that the combination of memory 906 and the above-referenced logic elements or software, firmware, instructions, etc., underlying the logic elements, as stored in memory 906 in non-transitory computer-readable form, defines a "computer program product" as that term is understood in the patent lexicon. In view of the descriptions herein, persons skilled in the art will readily be capable of providing suitable software or firmware or otherwise configuring transceiver 900 to operate in the manner described.

Data frame buffer logic 914 may contribute to the functions described above with regard to, for example, block 702 (FIG. 7). Messaging system logic 932 also may contribute to the functions described above with regard to block 702. Also, processor system 902, as configured with data frame buffer logic 914, may serve as a means for performing such functions. Bit extractor logic 920 may contribute to the functions described above with regard to, for example, block 704 (FIG. 7). Also, processor system 902, as configured with bit extractor logic 920, may serve as a means for performing such functions. Trellis encoder logic 916 may contribute to the functions described above with regard to, for example, block 706 (FIG. 7). Also, processor system 902, as configured with trellis encoder logic 916, may serve as a means for performing such functions. Constellation mapper logic 918 may contribute to the functions described above with regard to, for example, block 708 (FIG. 7). Also, processor system 902, as configured with constellation mapper logic 918, may serve as a means for performing such functions. Also, processor system 902, as configured with constellation mapper logic 918, may serve as a means for performing such functions. DMT symbol sampler logic 922 may contribute to the functions described above with regard to, for example, block 802 (FIG. 8A). Also, processor system 902, as configured with DMT symbol sampler logic 922, may serve as a means for performing such functions. Constellation de-mapper logic 924 may contribute to the functions described above with regard to, for example, block 804 (FIG. 8A). Also, processor system 902, as configured with constellation de-mapper logic 924, may serve as a means for performing such functions. Trellis decoder logic 926 may contribute to the functions described above with regard to, for example, block 806 (FIG. 8A). Also, processor system 902, as configured with trellis decoder logic 926, may serve as a means for performing such functions. SNR estimator logic 928 may contribute to the functions described above with regard to, for example, block 810 (FIG. 8A). Also, processor system 902, as configured with SNR estimator logic 928, may serve as a means for performing such functions. Tone list generator logic 930 may contribute to the functions described above with regard to, for example, blocks 812-818 (FIG. 8A). Also, processor system 902, as configured with tone list generator logic 830, may serve as a means for performing such functions. Messaging system logic 932 may contribute to the functions described above with regard to, for example, blocks 820-822 (FIG. 8B). Also, processor system 902, as configured with messaging system logic 932, may serve as a means for performing such functions.

One or more illustrative or exemplary embodiments of the invention have been described above. However, it is to be understood that the invention is defined by the appended claims and is not limited to the specific embodiments described.

What is claimed is:

1. A method for discrete multitone (DMT) data transmission, comprising:
   identifying a first set of tones and a second set of tones;
   selecting a first bit group comprising a first plurality of bits of a payload data frame, the first bit group corresponding to the first set of tones;
   selecting a second bit group comprising a second plurality of bits of the payload frame, the second bit group corresponding to the second set of tones;
   trellis encoding the first plurality of bits to produce a first trellis coded tone group;
   constellation mapping the first trellis coded tone group and the second bit group to produce a DMT symbol; and
   transmitting the DMT symbol via a communication channel.

2. The method of claim 1, wherein identifying a first set of tones and a second set of tones comprises receiving a message indicating whether a tone is included in one of the first set of tones and the second set of tones.

3. The method of claim 2, wherein:
   the communication channel is one of a very high-speed digital subscriber line (VDSL) channel and a fast access to subscriber terminal (FAST) channel; and
   receiving a message identifying a tone comprises receiving a message identifying a tone via an Embedded Operations Channel.

4. The method of claim 2, wherein the message comprises a list of one of the first set of tones and the second set of tones.

5. The method of claim 2, wherein the message indicates a signal-to-noise ratio (SNR) of the tone identified by the message, the method further comprising:
   comparing the SNR with a threshold; and
   adding the tone identified by the message to one of the first set of tones and the second set of tones in response to a result of comparing the SNR with the threshold.

6. The method of claim 2, wherein the message is received by a transmitter of the DMT symbol during a training operation preceding a communication session between the transmitter and a receiver.

7. The method of claim 6, wherein the communication channel is one of a very high-speed digital subscriber line (VDSL) channel and a fast access to subscriber (FAST) channel.

8. The method of claim 2, wherein the message is received by the transmitter during a communication session between the transmitter and a receiver.

9. The method of claim 8, wherein the communication channel is one of a very high-speed digital subscriber line (VDSL) channel and a fast access to subscriber (FAST) channel.

10. A method for discrete multitone (DMT) data reception, comprising:
    receiving a DMT symbol via a communication channel;
    constellation de-mapping the DMT symbol to produce a first plurality of bits defining a first bit group and a second plurality of bits defining a second bit group, the first bit group corresponding to a first set of tones, the second bit group corresponding to a second set of tones;
    trellis decoding the first plurality of bits to produce a plurality of trellis decoder output bits;
    combining the trellis decoder output bits and the second plurality of bits to produce a payload data frame;
    estimating a signal-to-noise ratio (SNR) of each of a plurality of tones;
    selecting the first set of tones and the second set of tones from the plurality of tones by comparing the SNR of each of the plurality of tones with a threshold; and
    transmitting a message via a messaging channel identifying a tone whether a tone is included in one of the first set of tones and the second set of tones.

11. The method of claim 10, wherein:
    the communication channel is one of a very high-speed digital subscriber line (VDSL) channel and a fast access to subscriber terminal (FAST) channel; and
    transmitting a message identifying a tone comprises transmitting a message identifying a tone via an Embedded Operations Channel.

12. The method of claim 10, wherein the message comprises a list of one of the first set of tones and the second set of tones.

13. The method of claim 10, wherein the message is transmitted by a receiver of the DMT symbol during a training operation preceding a communication session between the transmitter and the receiver.

14. The method of claim 13, wherein the communication channel is one of a very high-speed digital subscriber line (VDSL) channel and a fast access to subscriber (FAST) channel.

15. The method of claim 10, wherein the message is transmitted by a receiver of the DMT symbol during a communication session between the transmitter and the receiver.

16. The method of claim 15, wherein the communication channel is one of a very high-speed digital subscriber line (VDSL) channel and a fast access to subscriber (FAST) channel.

17. A transmitter system for discrete multitone (DMT) data communication, comprising:
    a memory configured to store information indicating whether each of a plurality of tones is included in one of a first set of tones and a second set of tones;
    a data frame buffer configured to buffer a payload data frame;
    a bit extractor configured to select a first bit group comprising a first plurality of bits of the data frame buffer and a second bit group comprising a second plurality of bits of the data frame buffer, the first bit group corresponding to the first set of tones, the second bit group corresponding to the second set of tones;
    a trellis encoder configured to encode the first plurality of bits to produce a first trellis coded tone group; and
    a constellation mapper configured to produce a DMT symbol in response to the first trellis coded tone group and the second bit group for transmission via a communication channel.

18. The transmitter system of claim 17, further comprising a messaging system configured to receive a message indicating whether a tone is included in one of the first set of tones and the second set of tones.

19. The transmitter system of claim 18, wherein the message comprises a list of one of the first set of tones and the second set of tones.

20. The transmitter system of claim 18, wherein the messaging system is configured to receive the message during a training operation preceding a communication session between the transmitter system and a receiver system.

21. The transmitter system of claim 20, wherein the communication channel is one of a very high-speed digital subscriber line (VDSL) channel and a fast access to subscriber (FAST) channel.

22. The transmitter system of claim 18, wherein the messaging system is configured to receive the message during a communication session between the transmitter and a receiver.

23. The transmitter system of claim 22, wherein the communication channel is one of a very high-speed digital subscriber line (VDSL) channel and a fast access to subscriber (FAST) channel.

24. A receiver system for discrete multitone (DMT) data communication, comprising:
  a constellation de-mapper configured to de-map a DMT symbol received via a communication channel to produce a first plurality of bits defining a first bit group and a second plurality of bits defining a second bit group, the first bit group corresponding to a first set of tones, the second bit group corresponding to a second set of tones;
  a trellis decoder configured to trellis decode the first plurality of bits to produce a plurality of trellis decoder output bits;
  a combiner configured to combine the trellis decoder output bits and the second plurality of bits to produce a payload data frame;
  a signal-to-noise ratio (SNR) estimator configured to estimate a signal-to-noise ratio (SNR) of each of a plurality of tones;
  a tone selector configured to select the first set of tones and the second set of tones from the plurality of tones by comparing the SNR of each of the plurality of tones with a threshold; and
  a messaging system configured to transmit a message via a messaging channel identifying a tone whether a tone is included in one of the first set of tones and the second set of tones.

25. The receiver system of claim 24, wherein:
  the communication channel is one of a very high-speed digital subscriber line (VDSL) channel and a fast access to subscriber terminal (FAST) channel; and
  transmitting a message identifying a tone comprises transmitting a message identifying a tone via an Embedded Operations Channel.

26. The receiver system of claim 24, wherein the message comprises a list of one of the first set of tones and the second set of tones.

27. The receiver system of claim 24, wherein the message is transmitted by a receiver of the DMT symbol during a training operation preceding a communication session between the transmitter and the receiver.

28. The receiver system of claim 27, wherein the communication channel is one of a very high-speed digital subscriber line (VDSL) channel and a fast access to subscriber (FAST) channel.

29. The receiver system of claim 24, wherein the message is transmitted by a receiver of the DMT symbol during a communication session between the transmitter and the receiver.

30. The receiver system of claim 29, wherein the communication channel is one of a very high-speed digital subscriber line (VDSL) channel and a fast access to subscriber (FAST) channel.

* * * * *